US 8,563,367 B2

(12) United States Patent
Kwon (10) Patent No.: US 8,563,367 B2
(45) Date of Patent: Oct. 22, 2013

(54) METHOD OF FABRICATING ARRAY SUBSTRATE FOR IN-PLANE SWITCHING MODE LIQUID CRYSTAL DISPLAY DEVICE

(71) Applicant: LG Display Co., Ltd., Seoul (KR)

(72) Inventor: Oh-Nam Kwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/723,594

(22) Filed: Dec. 21, 2012

(65) Prior Publication Data

US 2013/0237052 A1  Sep. 12, 2013

(30) Foreign Application Priority Data

Mar. 7, 2012  (KR) .................. 10-2012-0023207

(51) Int. Cl.
*H01L 21/00* (2006.01)

(52) U.S. Cl.
USPC ........... 438/149; 438/153; 438/734; 438/735; 257/E21.017

(58) Field of Classification Search
USPC ......... 438/149, 153, 155, 734–739, 742, 754; 257/E21.017
See application file for complete search history.

(56) References Cited

U.S. PATENT DOCUMENTS 7,416,926 B2 * 8/2008 Heo .............................. 438/153

* cited by examiner

*Primary Examiner* — Thanhha Pham
(74) *Attorney, Agent, or Firm* — Morgan, Lewis & Bockius LLP

(57) ABSTRACT

A method of fabricating an array substrate for an in-plane switching (IPS)-mode liquid crystal display (LCD) device, which includes a common electrode and a pixel electrode with a fine line width, are provided. The formation of the pixel electrode and the common electrode of the array substrate includes depositing two different metal layers and patterning the two different metal layers using a selective etching process. Thus, the pixel electrode and a central common electrode may be formed to have a fine line width so that the IPS-mode LCD device can have an improved aperture ratio.

11 Claims, 11 Drawing Sheets

*related art*

METHOD OF FABRICATING ARRAY SUBSTRATE FOR IN-PLANE SWITCHING MODE LIQUID CRYSTAL DISPLAY DEVICE

The present application claims the priority benefit of Korean Patent Application No. 10-2012-0023207 filed in the Republic of Korea on Mar. 7, 2012, which is hereby incorporated by reference in its entirety.

BACKGROUND

1. Field of the Disclosure

The present disclosure relates to a liquid crystal display (LCD) device, and more particularly, to a method of fabricating an array substrate for an in-plane switching (IPS)-mode LCD device including a common electrode and pixel electrodes having fine line widths.

2. Discussion of the Related Art

A liquid crystal display (LCD) device, which is advantageous to displaying moving images and popularly used for televisions and monitors due to a high contrast ratio, may form images based on optical anisotropy and polarization of liquid crystals (LCs).

The LCD device may include an LC panel as an essential component. The LC panel may be formed by interposing a liquid crystal layer between two substrates disposed in parallel to each other and bonding the liquid crystal layer to the two substrates. In the LCD device, a direction in which LC molecules are arranged may be changed according to an electric field generated in the LC panel to obtain a difference in transmittance.

Recently, an active-matrix (AM)-type LCD device configured to drive LCs according to a vertically generated electric field has been widely employed because the AM-type LCD device has a high resolution and is highly capable of embodying moving images. However, the AM-type LCD device has poor viewing angle characteristics because LCs are driven due to a vertically applied electric field.

For this reason, various methods for overcoming a narrow viewing angle have been proposed. Among these, a method of driving LCs according to a horizontal electric field is being watched with interest.

Figure 1:
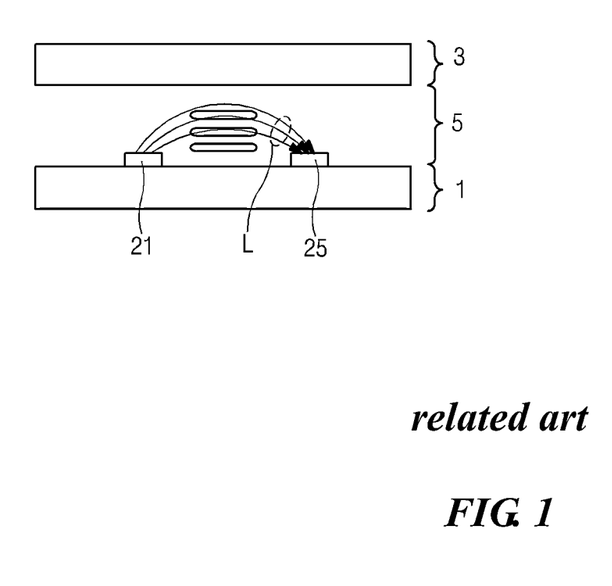
FIG. 1 is a schematic cross-sectional view of a liquid crystal (LC) panel of a typical in-plane switching (IPS)-mode liquid crystal display (LCD) device.

FIG. 1 is a schematic cross-sectional view of a LC panel of a typical in-plane switching-mode LCD device.

Referring to FIG. 1, a lower substrate 1 serving as an array substrate and an upper substrate 3 serving as a color filter substrate may be disposed apart from and opposite each other, and a liquid crystal layer 5 may be interposed between the upper and lower substrates 1 and 3.

A common electrode 21 and a pixel electrode 25 may be formed on the same planar surface of the lower substrate 1. The liquid crystal layer 5 may operate according to a horizontal electric field L generated by the common electrode 21 and the pixel electrode 25.

As described above, the in-plane switching-mode LCD device may include the common electrode 21 and the pixel electrode 25 formed on the lower substrate 1, and generate the horizontal electric field L between the two electrodes 21 and 25 so that LC molecules can be arranged in parallel to the horizontal electric field L that is parallel to the upper and lower substrates 1 and 3. Thus, a viewing angle of the LCD device may be widened.

Meanwhile, in the in-plane switching-mode LCD device, since the liquid crystal layer 5 operates due to the horizontal electric field L formed between the pixel electrode 25 and the common electrode 21, it is impossible to drive the liquid crystal layer 5 disposed on the pixel electrode 25 and the common electrode 21. Accordingly, an aperture ratio may be reduced by as much as the areas of the pixel electrode 25 and the common electrode 21.

For this reason, to improve an aperture ratio, a pixel electrode and a common electrode having a fine line width are required for recent in-plane switching-mode LCD devices. However, formation of the pixel electrode and the common electrode with a line width of less than about 2.5 µm is technically limited due to the resolution limit of current exposure tools.

SUMMARY OF THE INVENTION

Accordingly, the present invention is directed to a method of fabricating an array substrate for an in-plane switching (IPS)-mode liquid crystal display (LCD) device that substantially obviates one or more of the problems due to limitations and disadvantages of the related art.

An object of the present disclosure is to provide an IPS-mode LCD device in which pixel electrodes and a common electrode are formed to have a fine line width of about 2.5 µm or less.

Another object of the present disclosure is to provide an IPS-mode LCD device having an improved aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating an array substrate for an IPS-mode LCD device includes: sequentially forming a first metal layer and a second metal layer on a substrate; forming a photoresist pattern on the second metal layer, the photoresist pattern having a first line width; etching the first metal layer and the second metal layer exposed outside the photoresist pattern to form a first metal pattern and a second metal pattern of a double-layered structure having a second line width smaller than the first line width; removing the photoresist pattern; selectively etching the first metal pattern using the second metal pattern as a mask and a first etchant for selectively etching the first metal pattern to have a third line width smaller than the second line width to form a pixel electrode and a common electrode; and selectively etching and removing the second metal pattern using a second etchant for selectively etching the second metal pattern.

The first line width may range from about 2.5 µm to about 3.5 µm, the second line width may range from about 1.5 µm to about 2.5 µm, and the third line width may range from about 0.5 µm to about 1.0 µm. The first metal layer may be formed of one selected from the group consisting of titanium molybdenum (MoTi), molybdenum, titanium, a molybdenum alloy, a titanium alloy, indium tin oxide (ITO), indium zinc oxide (IZO), and indium tin zinc oxide (ITZO).

The second metal layer may be formed of one selected from copper (Cu), aluminum (Al), an aluminum alloy, silver (Ag), and a silver alloy. The first metal layer may be formed of titanium molybdenum, and the second metal layer may be formed of copper. The first etchant may contain hydrogen peroxide ($H_2O_2$) and fluorine (F), and the second etchant may contain potassium sulfate ($K_2SO_4$) and an organic acid.

Each of the first and second etchants may include an inhibitor and a surfactant. The formation of the first and second metal patterns may include etching the first and second metal layers using a mixed etchant, and the mixed etchant may include potassium sulfate, hydrogen peroxide, fluorine, an inhibitor, and a surfactant.

Before forming the first metal layer, the method may further include: forming gate lines and data lines on the substrate across each other to define pixel regions, forming a common line in parallel to and apart from the gate line, and forming a thin film transistor (TFT) on each of the pixel regions to be connected to the gate line and the data line; and forming a protection layer on the TFT. The formation of the pixel electrode and the common electrode may include forming a subsidiary common pattern and a subsidiary pixel pattern on the protection layer in each of the pixel regions to be apart from and opposite each other parallel to the gate line, the subsidiary common pattern configured to connect all one ends of common electrodes, and the subsidiary pixel pattern configured to connect all one ends of pixel electrodes.

The formation of the common line may include forming an outermost common electrode in parallel to the data line in each of the pixel regions, the outermost common electrode branched from the common line. The formation of the protection layer may include forming a drain contact hole exposing the drain electrode and a common contact hole exposing the outermost common electrode. Herein, the subsidiary common pattern may be in contact with the outermost common electrode through the common contact hole, and the subsidiary pixel pattern may be in contact with the pixel electrode through the drain contact hole. The TFT may include a gate electrode, a gate insulating layer, a semiconductor layer, and source and drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the exemplary embodiments, examples of which are illustrated in the accompanying drawings.

Figure 2:
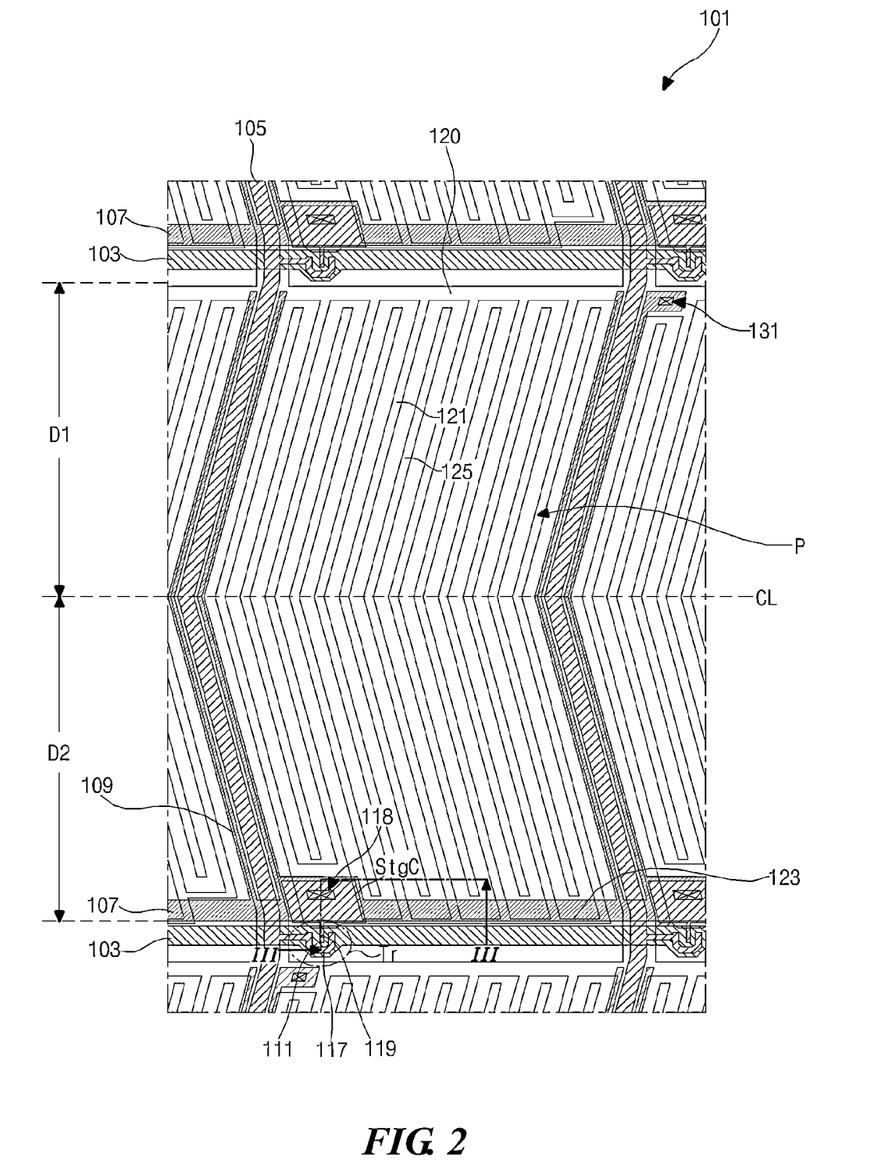
FIG. 2 is a schematic plan view of one pixel region of an array substrate for an IPS-mode LCD device according to an embodiment of the present invention.

FIG. 2 is a schematic plan view of one pixel region of an array substrate 101 for an in-plane switching (IPS)-mode LCD device according to an embodiment of the present invention.

Referring to FIG. 2, the array substrate 101 for the IPS-mode LCD device according to the embodiment of the present invention may include a plurality of gate lines 103 and data lines 105, which may be respectively formed under and on a gate insulating layer (refer to 113 in FIG. 3), extend in longitudinal and traverse directions, respectively, and cross one another to define pixel regions P.

In addition, a common line 107 may be formed apart from the gate lines 103 to penetrate each of the pixel regions P.

Furthermore, a thin-film transistor (TFT) Tr may be formed in each of the pixel regions P and connected to the gate line 103 and the data line 105. The TFT Tr may include a gate electrode 111, the gate insulating layer 113, a semiconductor layer (refer to 115 in FIG. 3), and source and drain electrodes 117 and 119 spaced apart from each other. Here, the semiconductor layer 115 may include an active layer (refer to 115a in FIG. 3) formed of pure amorphous silicon (a-Si) and an ohmic contact layer (refer to 115b in FIG. 3) formed of doped a-Si.

Although FIG. 2 shows an example in which a channel region of the TFT Tr has a 'U' shape, the channel region may be modified into various shapes.

An outermost common electrode 109, which is branched from the common line 107, may be formed in parallel to the data line 105 in each of the pixel regions P. The outermost common electrode 109 and the common line 107 may be formed of the same material in the same layer as the gate line 103 and the gate electrode 111.

In addition, a subsidiary common pattern 120 may be formed in each of the pixel regions P and configured to receive a common voltage from the outermost common electrode 109. A plurality of central common electrodes 121, which are branched from the subsidiary common pattern 120, may be formed in each of the pixel electrodes P. The plurality of central common electrodes 121 may be formed in bar shapes parallel to the outermost common electrode 109 and spaced a predetermined distance apart from one another.

In consideration of a reduction in aperture ratio, the subsidiary common pattern 120 formed in one of three pixel regions P disposed adjacent to one another along a horizontal line may be in contact with the outermost common electrode 109 through a common contact hole 131 and receive the common voltage.

Furthermore, a subsidiary pixel pattern 123 may be formed in parallel to the common line 107 in each of the pixel regions P and connected to the drain electrode 119 of the TFT Tr through a drain contact hole 118. A plurality of pixel electrodes 125, which are branched from the subsidiary pixel pattern 123, may be formed in bar shapes in each of the pixel regions P.

The plurality of bar-shaped pixel electrode 125 may be formed alternately with the plurality of bar-shaped central common electrodes 121.

Here, when an imaginary line CL parallel to the gate line 103 is drawn from a central portion of each of the pixel regions P, each of the common electrodes 109 and 121 and the pixel electrode 125 formed in each of the pixel regions P may have a symmetrically bent structure with respect to the imaginary line CL.

That is, each of the common electrodes 109 and 121 and the pixel electrode 125 may be bent at a predetermined angle with respect to the imaginary line clockwise or counter clockwise from a vertical direction to the imaginary line CL.

Accordingly, on the basis of the central portion of each of the pixel regions P, the common electrodes 109 and 121 and the pixel electrode 125 formed in an upper portion of each of the pixel regions P may be formed in a different direction from the common electrodes 109 and 121 and the pixel electrode 125 formed in a lower portion thereof so that the upper and lower portions of each of the pixel regions P can form different domain regions.

In this case, in the IPS-mode LCD according to the present embodiment, LCs disposed in the different domain regions of each of the pixel regions P may move differently. Finally, major axes of LC molecules disposed in the different domain regions of each of the pixel regions P may be disposed differently, thereby reducing color shift at a specific azimuth angle.

That is, when it is assumed for brevity that regions disposed on and under the imaginary line CL of each of the pixel regions P are first domain regions D1 and second domain regions D2, respectively, an azimuth angle at which color shift occurs in the first domain region D1 is different from an azimuth angle at which color shift occurs in the second domain region D2, so that the first and second domain regions D1 and D2 may compensate for the color shifts. As a result, a color shift phenomenon may be reduced.

In this case, the predetermined angle at which each of the outermost and central common electrodes 109 and 121 and the pixel electrode 125 may be bent may range from 7° to 10°. When each of the outermost and central common electrodes 109 and 121 and the pixel electrode 125 is bent at an angle larger than an angle of ±7° to ±10° with respect to the direction vertical to the imaginary line CL, domain regions may be separated more clearly in each of the pixel regions P, but a driving voltage may increase, and the overall white luminance may be reduced due to the characteristics of a voltage-time (V-T) curve. Therefore, each of the outermost and central common electrodes 109 and 121 and the pixel electrodes 125 may be bent at the above-described angle of ±7° to ±10° with respect to the direction vertical to the imaginary line CL.

Since the outermost and central common electrodes 109 and 121 and the pixel electrode 125 are bent, the data line 105 may also be symmetrically bent with respect to the central portion of each of the pixel regions P. Since the data line 105 is not separated into the respective pixel regions P but connected throughout a display region, the data line 105 may be bent with respect to the central portion of each of the pixel regions P and formed in a zigzag pattern in the entire display region.

Figure 3:
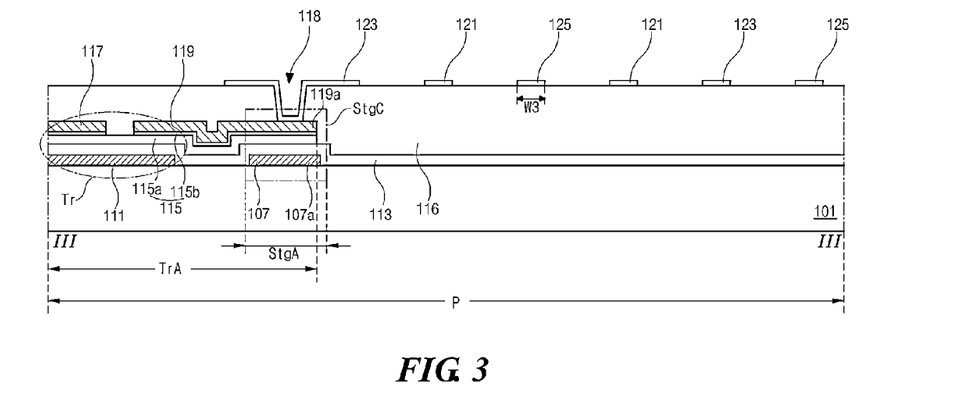
FIG. 3 is a cross-sectional view taken along line III-III of FIG. 2.

Meanwhile, in each of the pixel regions P, the common line 107 may be formed to a greater width near the TFT Tr than in the remaining region, and form a first storage electrode (refer to 107a in FIG. 3). The drain electrode 119 may extend over the first storage electrode 107a with the gate insulating layer 113 therebetween, and form a second storage electrode (refer to 119a in FIG. 3). In this case, the first and second storage electrodes 107a and 109a, which may overlap each other with the gate insulating layer 113 therebetween, may constitute a storage capacitor StgC.

Here, the outstanding feature of the present embodiment is that the bar-shaped central common electrode 121 and pixel electrode 125, each having a line width (refer to W3 in FIG. 3) of about 0.5 µm to about 1.5 µm, are provided.

Accordingly, in the IPS-mode LCD device according to the embodiment of the present invention, each of the common electrode 121 and the pixel electrode 125 may be formed to have a fine line width W3 of about 0.5 µm to about 1.5 µm, so that an aperture ratio may be improved as compared with that of a conventional IPS-mode LCD device having a line width of about 2.5 µm or more.

FIG. 3 is a cross-sectional view taken along line III-III of FIG. 2.

For brevity, a portion of each of pixel regions P in which a TFT Tr will be formed is defined as a switching region TrA, and a portion of each of the pixel regions P in which a storage capacitor StgC will be formed is defined as a storage region StgA.

As shown in FIG. 3, an array substrate 101 for an IPS-mode LCD may include a plurality of gate lines (refer to 103 in FIG. 2) and a plurality of data lines (refer to 105 in FIG. 2). The plurality of gate lines 103 may extend in a first direction. The plurality of data lines 105 may extend in a second direction across the plurality of gate lines 103 and define a plurality of pixel regions P.

In addition, a common line 107 may be formed through each of the pixel regions P and spaced apart from the gate line 103.

Furthermore, the TFT Tr may be formed to correspond to the switching region TrA of each of the pixel regions P and connected to the gate line 103 and the data line 105. The TFT Tr may include a gate electrode 111, a gate insulating layer 113, a semiconductor layer 115 having an active layer 115a formed of pure a-Si and an ohmic contact layer 115b formed of doped a-Si, and source and drain electrodes 117 and 119 spaced apart from each other.

In this case, a partial region of the gate line 103 may form the gate electrode 111.

A protection layer (refer to 131 in FIG. 2) including a common contact hole (refer to 131 in FIG. 2) and a drain contact hole 118 exposing a drain electrode 119 may be formed on the entire surface of the array substrate 101 including the TFT Tr. The common contact hole 131 may expose one end of an outermost common electrode (refer to 109 in FIG. 2), and the drain contact hole 118 may expose the drain electrode 119. A pixel electrode 125 formed of titanium molybdenum (MoTi) and a central common electrode 121 may be formed on the protection layer 116 in the pixel region P.

In this case, the pixel electrode 125 may be branched from a subsidiary pixel pattern 123 formed in parallel to the common line 107 and electrically connected to the drain electrode 119 through the drain contact hole 118. The central common electrode 121 may be branched from a subsidiary common pattern (refer to 120 in FIG. 2) connected to the outermost common electrode 109 through the common contact hole 131, and formed in parallel to the pixel electrode 125.

In this case, a first storage electrode 107a and a second storage electrode 119a may be formed in the storage region StgA formed in each of the pixel regions P. The first storage electrode 107a may extend from the common line 107, and the second storage electrode 119a may extend from the drain electrode 119 and be formed on the first storage electrode 107a with a gate insulating layer 113 therebetween. In this case, the first and second storage electrodes 107a and 119a, which may overlap each other with the gate insulating layer 113 therebetween, may constitute a storage capacitor StgC.

In the above-described IPS-mode LCD, the common electrode 121 and the pixel electrode 125 may be formed on the array substrate 101, and a horizontal electric field may be generated between the two electrodes 121 and 125 so that LC molecules can be arranged in parallel to the horizontal electric field generated in parallel to the substrate 101. As a result, a viewing angle of the LCD may widen.

The present embodiment is most characterized in that each of the bar-shaped central common electrode 121 and pixel electrode 125 is formed to a line width W3 of about 0.5 μm to about 1.5 μm.

Accordingly, since each of the common electrode 121 and the pixel electrode 125 may be formed to a fine line width of about 0.5 μm about 1.5 μm, the IPS-mode LCD device according to the present embodiment may have an improved aperture ratio as compared with a conventional IPS-mode LCD device having a line width of about 2.5 μm or more.

That is, in an IPS-mode LCD device, since LCs are driven according to a horizontal electric field between the common electrode 121 and the pixel electrode 125, it is impossible to drive LCs disposed on the common electrode 121 and the pixel electrode 125. Accordingly, an aperture ratio may be reduced by as much as the areas of the common electrode 121 and the pixel electrode 125. However, in the IPS-mode LCD device according to the present invention, since the central common electrode 121 and the pixel electrode 125 may be formed to a fine line width, a region in which LCs are not driven on the common electrode region 121 and the pixel electrode 125 may be reduced to improve the aperture ratio.

Since characteristic constructions of the present invention may be expressed more effectively with reference to a fabrication method, a method of fabricating an array substrate for an IPS-mode LCD device according to an embodiment of the present invention will now be described in further detail.

FIGS. 4A through 4L are cross-sectional views taken along line III-III of FIG. 2, illustrating respective process operations of a method of fabricating an array substrate for an IPS-mode LCD device according to an embodiment of the present invention, and FIGS. 5A through 5E are scanning electron microscope (SEM) images of electrodes corresponding to the process operations of FIG. 4A through 4L.

Figure 4A:
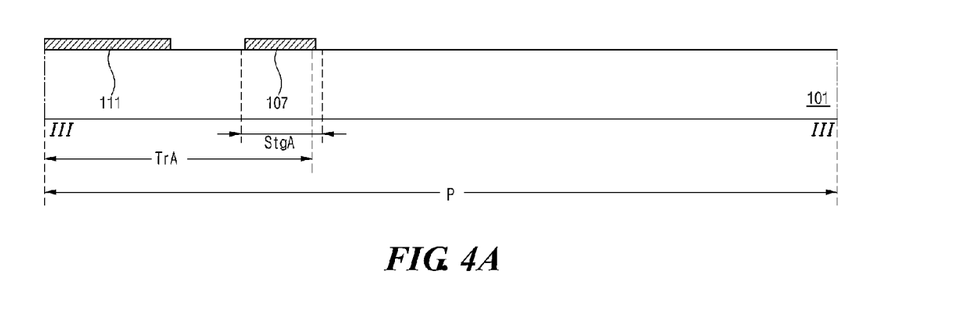
FIGS. 4A through 4L are cross-sectional views taken along line III-III of FIG. 2, illustrating respective process operations of a method of fabricating an array substrate for an IPS-mode LCD device according to an embodiment of the present invention.

To begin with, referring to FIG. 4A, a first metal having low resistance characteristics, for example, one selected from molybdenum (Mo), aluminum (Al), an aluminum alloy (e.g., aluminum neodymium (AlNd)), copper (Cu), and a copper alloy, may be deposited on the entire surface of a transparent insulating substrate 101, thereby forming a first metal layer (not shown).

Thereafter, the first metal layer may be patterned using a mask process. The mask process may include a series of unit processes including, for example, coating photoresist (not shown), exposing the photoresist using a photomask (not shown), developing the exposed photoresist (not shown), etching a first metal layer (not shown), and stripping the photoresist (not shown). As a result, a plurality of gate lines (refer to 103 in FIG. 2) may be formed to extend in a first direction, and a gate electrode 111 may be simultaneously connected in a switching region TrA to be connected to the corresponding one of the gate lines 103.

In this case, the first metal layer having a double-layered or multi-layered structure may be formed by sequentially depositing different metals, and patterned to form gate lines (not shown) and the gate electrode 111 having a double-layered or multi-layered structure.

Simultaneously, a common line 107 may be formed a predetermined distance apart from and in parallel to the gate line 103, and an outermost common electrode (refer to 109 in FIG. 2) may be formed to be connected to the common line 107.

Figure 4B:
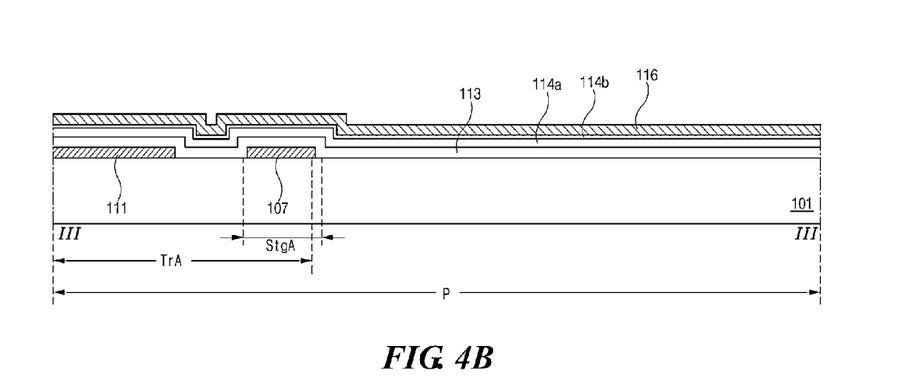

Next, referring to 4B, an inorganic insulating material, for example, silicon oxide ($SiO_2$) or silicon nitride ($SiN_x$), may be deposited on the gate line 103, the gate electrode 111, the common line 107, and the outermost common electrode 109, thereby forming a gate insulating layer 113 on the entire surface of the substrate 101.

Also, pure amorphous silicon (a-Si) and doped a-Si may be sequentially deposited on the gate insulating layer 113, thereby forming a pure a-Si material layer 114a and a doped a-Si material layer 114b.

Thereafter, a metal having low resistance characteristics, for example, one selected from the group consisting of copper, aluminum, molybdenum, and a copper alloy, may be deposited on the entire surface of the doped a-Si material layer 114b, thereby forming a second metal layer 116.

Figure 4C:
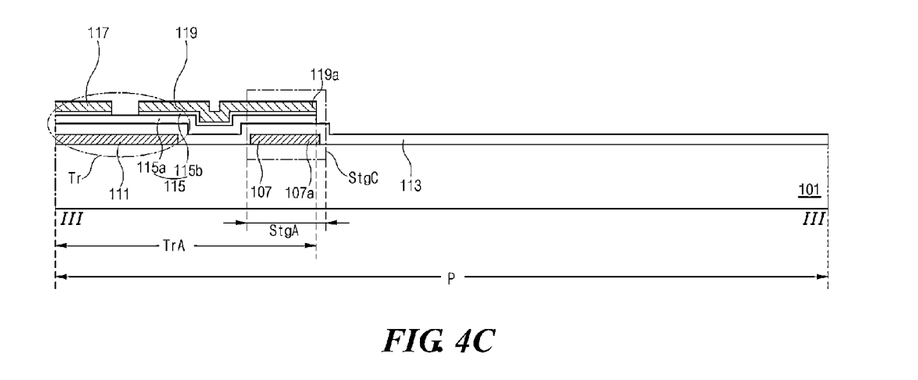

Next, the second metal layer 116, the pure a-Si material layer 114a, and the doped a-Si material layer 114b may be patterned using a mask process including a series of unit processes including coating photoresist (not shown), exposing the photoresist using a photomask (not shown), developing the exposed photoresist (not shown), etching the second metal layer 116, and stripping the photoresist (not shown). Thus, as shown in FIG. 4C, a plurality of data lines (refer to 105 in FIG. 2) may be formed to extend in a second direction and cross the gate lines 103 to define pixel regions P.

In this case, a semiconductor pattern having a double structure including a pure a-Si material and a doped a-Si material may be disposed under the data lines 105.

Simultaneously, a source electrode 117 and a drain electrode 119 may be formed in the switching region TrA and spaced apart from each other, and the doped a-Si material layer 114b may be removed by etching using the source and drain electrodes 117 and 119 as a mask, thereby forming an ohmic contact layer 115b to expose an active layer 115a.

As a result, a TFT Tr including the gate electrode 111, the gate insulating layer 113, a semiconductor layer 115 including the active layer 115 formed of pure a-Si and the ohmic contact layer 115b formed of doped a-Si, and the source and drain electrodes 117 and 119, which are spaced apart from each other, may be formed.

In this case, since the drain electrode 119 may extend to a portion in which the common line 107 is formed, the common line 107 and the drain electrode 119, which may overlap each other with the gate insulating layer 113 therebetween, may form a first storage electrode 107a and a second storage electrode 119a, respectively.

Accordingly, the first storage electrode 107a, the gate insulating layer 113, and the second storage electrode 119a, which are sequentially stacked in a storage region StgA, may constitute a storage capacitor StgC.

Figure 4D:
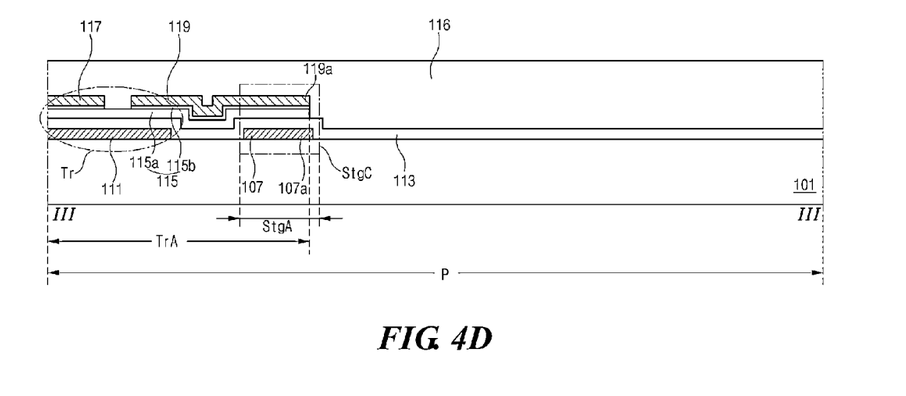

Next, as shown in FIG. 4D, a protection layer 116 formed of an inorganic insulating material or an organic insulating material may be formed on the entire surface of the substrate 101. The inorganic insulating material may be, for example, one selected out of silicon oxide and silicon nitride, and the organic insulating material may be, for example, benzocyclobutene (BCB) or photo acryl.

Figure 4E:
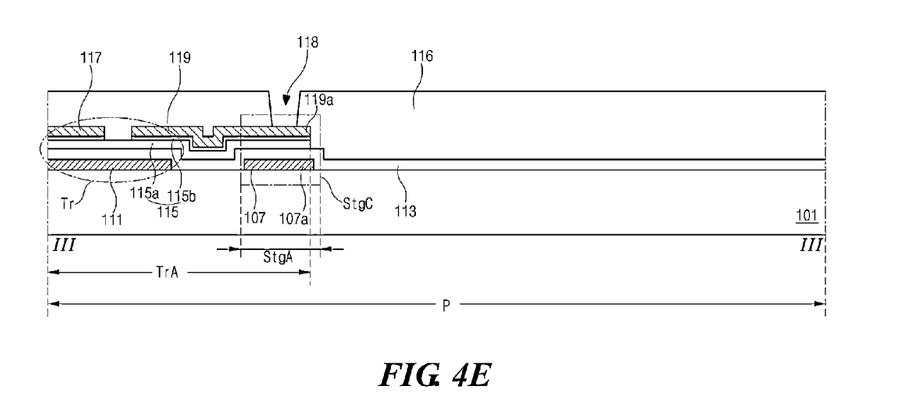

Subsequently, as shown in FIG. 4E, the protection layer 116 may be patterned using a mask process, thereby forming a drain contact hole 118 exposing the drain electrode 119.

Simultaneously, although not shown, even the gate insulating layer 113 disposed under the protection layer 116 may be patterned, thereby forming a common contact hole (refer to 131 in FIG. 2) exposing the outermost common electrode (refer to 109 in FIG. 2).

Figure 4F:
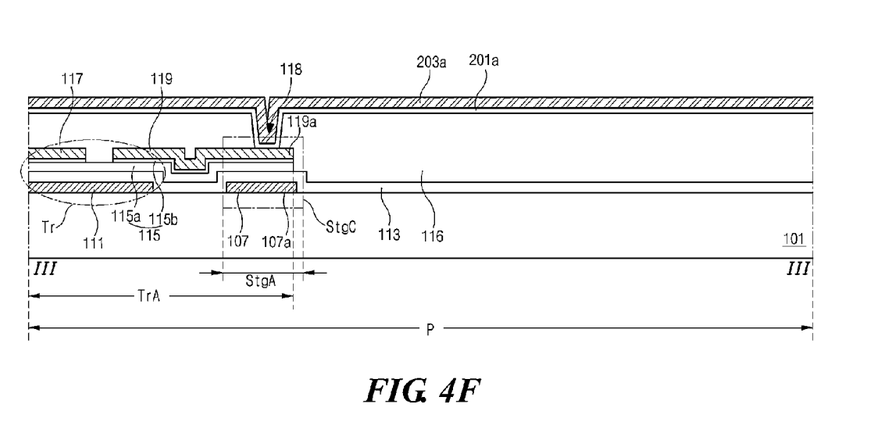

Next, as shown in FIG. 4F, titanium molybdenum and copper may be sequentially deposited on the entire surface of the substrate 101 to cover the protection layer 116 having the drain contact hole 118 and the common contact hole 131, thereby sequentially forming a third metal layer 201a and a fourth metal layer 203a.

Figure 4G:
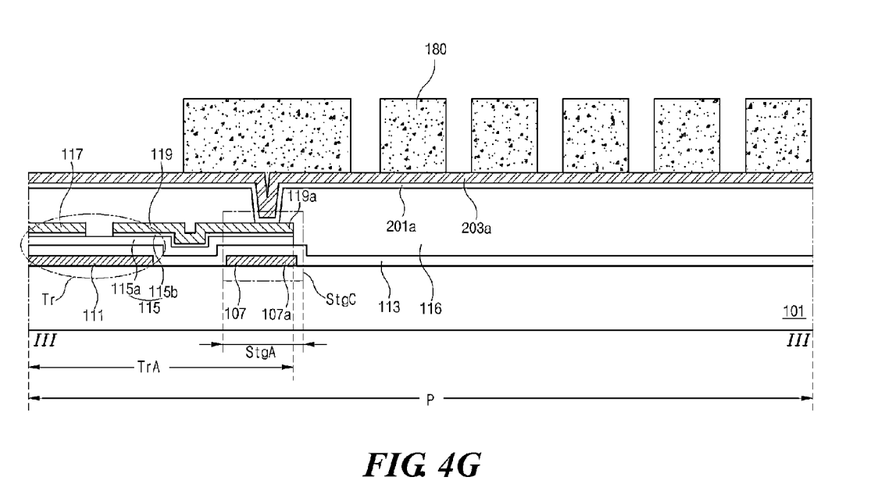

Afterwards, photoresist (not shown) may be coated on the fourth metal layer 203a to form a photoresist layer (not shown), and the photoresist layer may be exposed using a photomask and then developed. Thus, as shown in FIG. 4G, a photoresist pattern 180 having a first line width W1 of about 2.5 μm to about 3.5 μm may be formed to correspond to a portion at which a common electrode (refer to 121 in FIG. 3) and a pixel electrode (refer to 125 in FIG. 3) will be formed. Here, the first line width W1 of about 2.5 μm to about 3.5 μm may correspond to a minimum size obtained in consideration of exposure resolution.

In this case, the photoresist pattern 180 may also be formed to correspond to a portion at which a subsidiary common pattern (refer to 120 in FIG. 2) and a subsidiary pixel pattern (refer to 123 in FIG. 2) will be formed. The subsidiary common pattern 120 may connect one ends of the common electrodes 121 of the respective pixel regions P, and the subsidiary pixel pattern 123 may connect one ends of the pixel electrodes 125 of the respective pixel regions P.

Figure 4H:
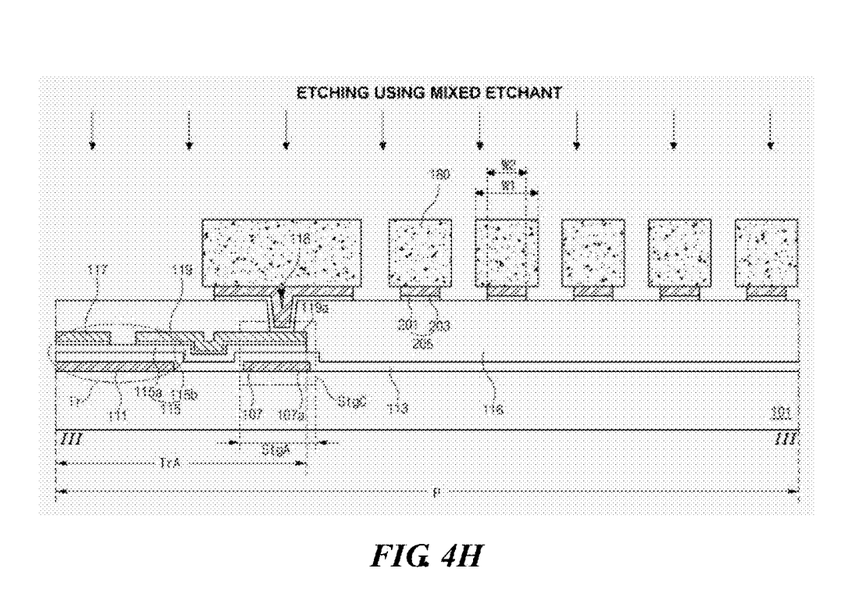
Figure 5A:
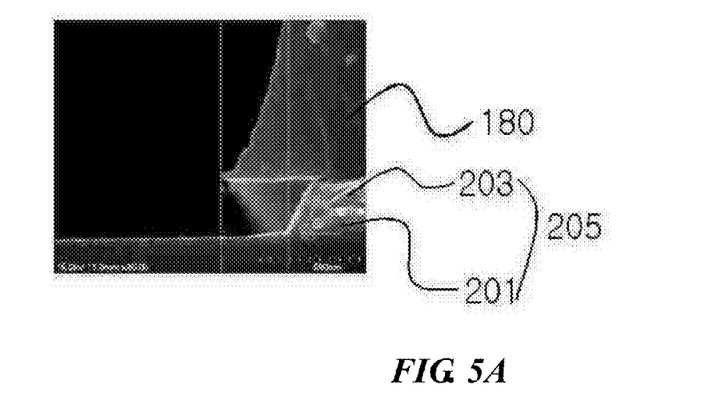
FIGS. 5A through 5E are scanning electron microscope (SEM) images of electrodes corresponding to the respective process operations of FIGS. 4A through 4L.

Next, as shown in FIGS. 4H and 5A, the fourth metal layer (refer to 203*a* in FIG. 4G) and the third metal layer (refer to 201*a* in FIG. 4G) exposed outside the photoresist pattern 180 may be etched using a mixed etchant capable of etching both copper contained in the fourth metal layer 203*a* and titanium molybdenum contained in the third metal layer 201*a*.

Here, the mixed etchant may contain potassium sulfate ($K_2SO_4$), hydrogen peroxide ($H_2O_2$), fluorine (F), an inhibitor, and a surfactant.

The third metal layer 201*a* formed of MoTi may be etched using hydrogen peroxide, the fourth metal layer 203*a* formed of copper may react with hydrogen peroxide to generate copper oxide (CuO), and copper oxide may react with potassium sulfate and be etched.

That is, the fourth metal layer 203*a* formed of copper may be etched by hydrogen peroxide and potassium sulfate.

In this case, the inhibitor may serve to prevent autolysis of hydrogen peroxide. The mixed etchant may contain about 1 to 5% by weight potassium sulfate, about 15 to 25% by weight hydrogen peroxide, about 0.1 to 1% by weight fluorine, about 0.5 to 5% by weight inhibitor, and about 0.05 to 1% by weight surfactant.

Here, the inhibitor may be an azole-based inhibitor, and the surfactant may be a silicon (Si)-based surfactant.

Accordingly, a metal pattern 205 having a double structure including a lower layer 201 formed of titanium molybdenum and an upper layer 203 formed of copper may be formed under the photoresist pattern 180.

In this case, a lateral selective etching process may be performed under the photoresist pattern 180 having a first line width W1 of about 2.5 μm to about 3.5 μm so that the metal pattern 205 may have the double structure having a second line width W2 that is about 1.0 μm smaller than the photoresist pattern 180.

Figure 4I:
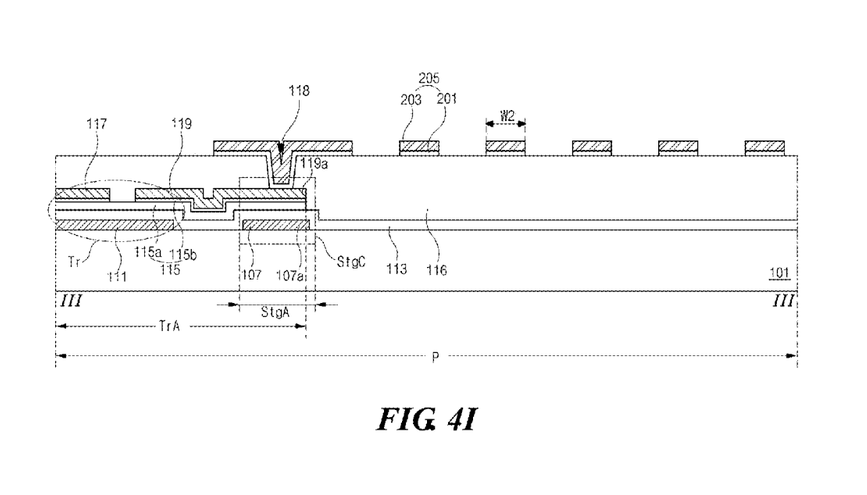
Figure 4J:
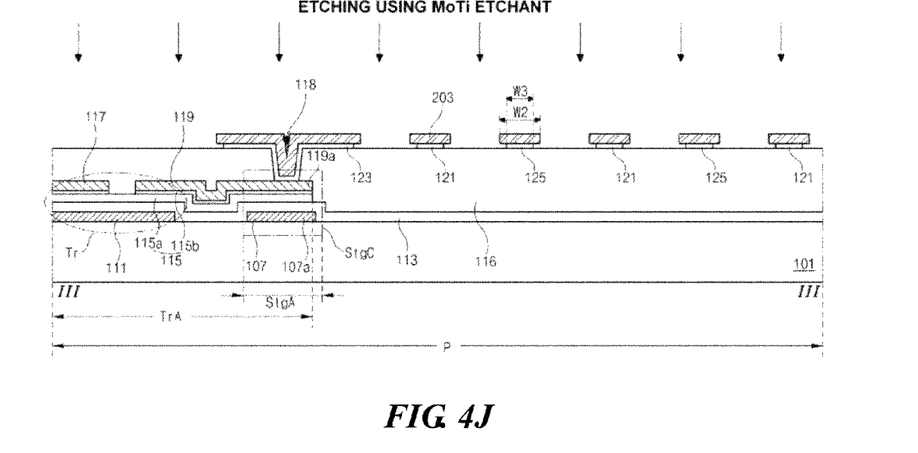
Figure 5B:
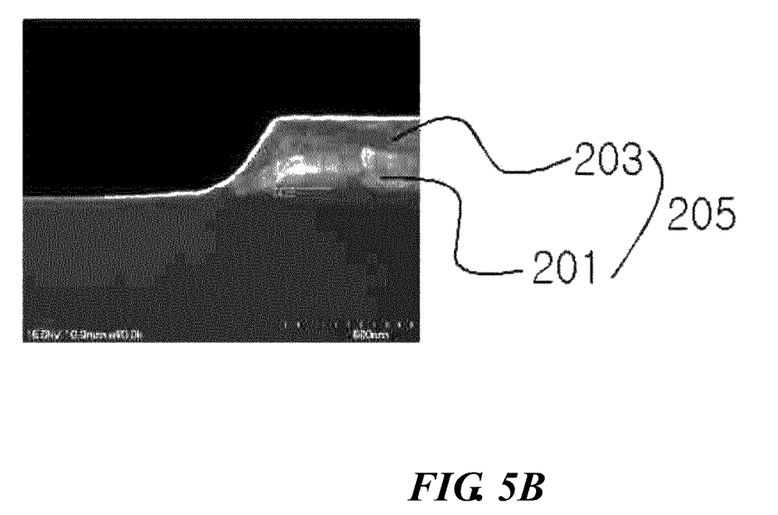
Figure 5C:
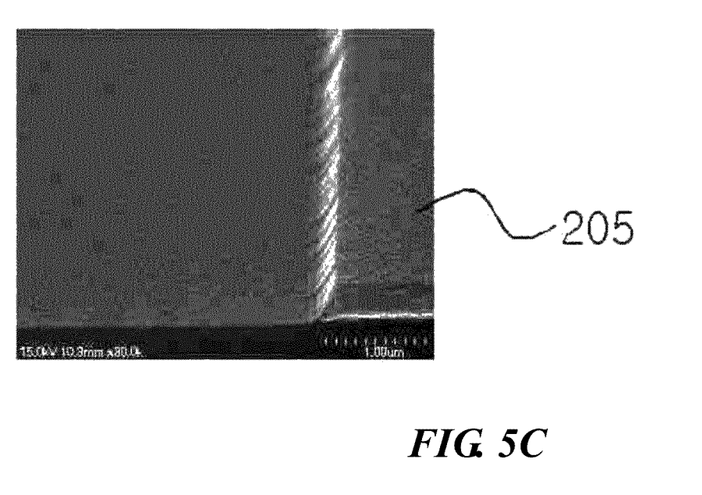
Figure 5D:
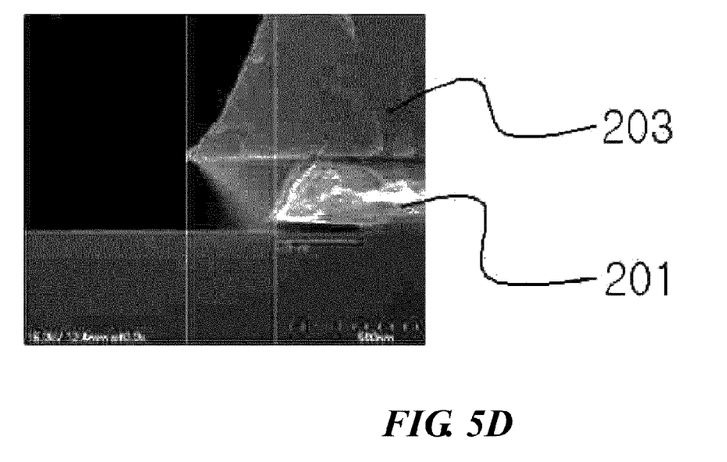

Next, as shown in FIGS. 4I, 5B, and 5C, the photoresist pattern (refer to 180 in FIG. 4H) remaining on the metal pattern 205 may be developed and removed. Thereafter, as shown in FIG. 4J, an etching process may be performed on the metal pattern 205 using a titanium molybdenum etchant capable of etching the lower layer (refer to 201 in FIG. 4I) formed of titanium molybdenum.

Here, the titanium molybdenum etchant may contain hydrogen peroxide, fluorine, an inhibitor, and a surfactant. In this case, the titanium molybdenum etchant may contain about 15 to 25% by weight hydrogen peroxide, about 0.1 to 1% by weight fluorine, about 0.5 to 5% by weight inhibitor, and about 0.05 to 1% by weight surfactant. The inhibitor may be an azole-based inhibitor, and the surfactant may be a silicon-based surfactant.

By use of the titanium molybdenum etchant, the lower layer 201 formed of titanium molybdenum may be laterally etched. That is, the lower layer 201 formed of titanium molybdenum may be laterally etched using the upper layer 203 having the second line width W2 of about 1.5 to 2.5 μm as a blocking mask so that each of both side portions of the lower layer 201 can be about 0.5 to 1.0 μm smaller than the upper layer 203. As a result, the pixel electrode 125 and the central common electrode 121 may be formed to have a third line width W3 that is about 1.0 to 2.0 μm smaller than the second line width W2 of the upper layer 203.

Accordingly, in the IPS-mode LCD device according to the present embodiment, the pixel electrode 125 and the central common electrode 121 may be formed to have a fine line width W3 of about 0.5 to 1.5 μm.

In addition to the pixel electrode 125 and the central common electrode 121, a subsidiary pixel pattern 123 and a subsidiary common pattern (refer to 120 in FIG. 2) may be formed. The subsidiary pixel pattern 123 may connect one ends of the pixel electrodes 125 and be connected to the drain electrode 119 through the drain contact hole 118. The subsidiary common pattern 120 may connect one ends of the common electrodes 121 and be connected to the outermost common electrode (refer to 109 in FIG. 2) through the common contact hole (refer to 131 in FIG. 2).

The pixel electrode 125 may be electrically connected to the drain electrode 119 through the drain contact hole 118, and the common electrode 121 may be electrically connected to the common line (refer to 107 in FIG. 2) through the common contact hole 131.

Figure 4K:
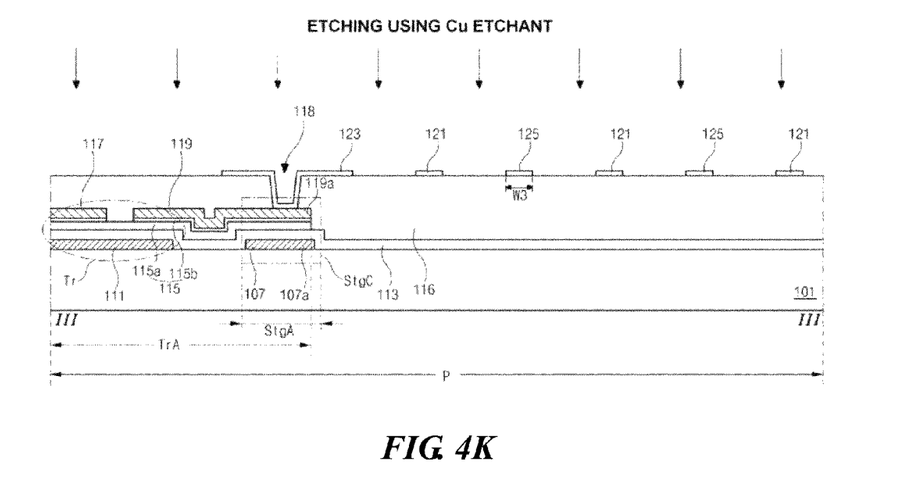

Next, as shown in FIG. 4K, an etching process may be performed on the upper layer 203 using a copper etchant capable of etching copper.

Here, the copper etchant may contain potassium sulfate, an inhibitor, an organic acid, and a surfactant.

The organic acid may contain glycolic acid. Thus, potassium sulfate contained in the copper etchant may react with copper of the upper layer 203 to generate copper oxide, and the copper oxide may be removed by etching due to the organic acid.

The copper etchant may contain about 1 to 5% by weight potassium sulfate, about 2 to 8% by weight organic acid, about 0.5 to 5% by weight inhibitor, and about 0.05 to 1% by weight surfactant. Here, the inhibitor may be an azole-based inhibitor, and the surfactant may be a silicon-based surfactant.

The upper layer 203 formed of copper may be removed by etching of the copper etchant.

Figure 4L:
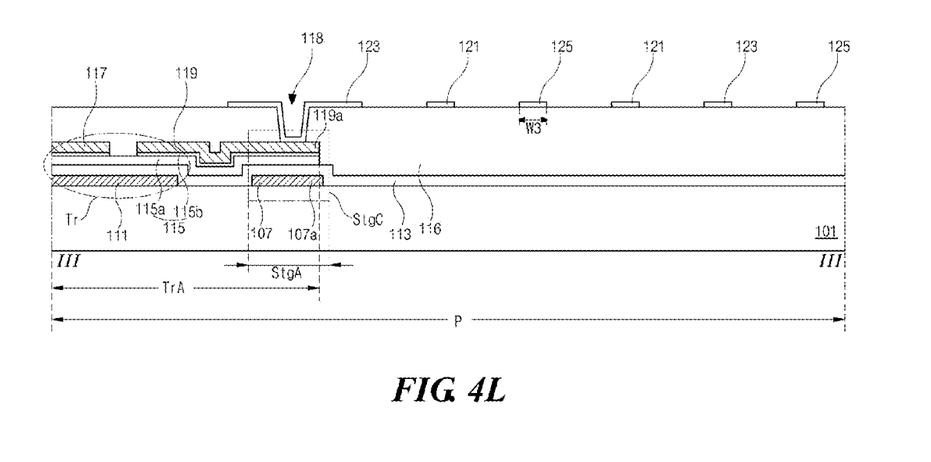
Figure 5E:
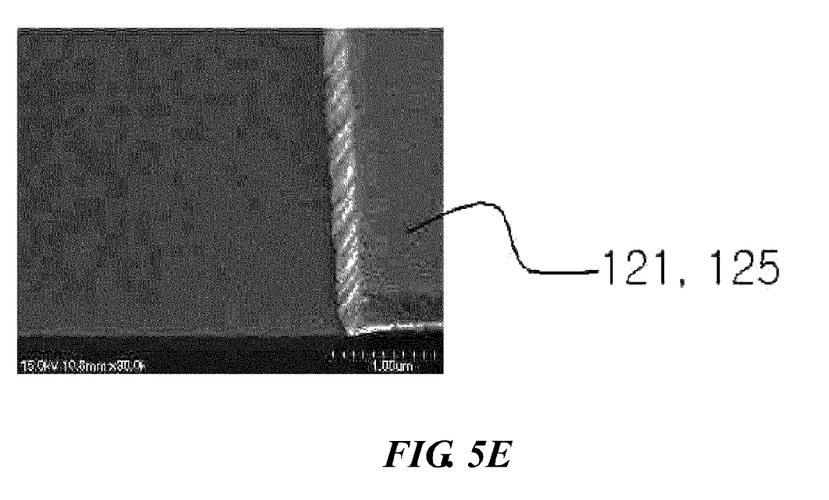

Accordingly, the upper layer 203 formed of copper on the pixel electrode 125 and the central common electrode 121 may be removed, thereby completing fabrication of the array substrate 101 for the IPS-mode LCD device having the pixel electrode 125 and the central common electrode 121 according to the present embodiment, as shown in FIGS. 4L and 5E.

In addition to titanium molybdenum, the third metal layer (refer to 201*a* in FIG. 4I) may be formed of one selected from the group consisting of molybdenum, titanium, a molybdenum alloy, a titanium alloy, indium tin oxide (ITO), indium zinc oxide (IZO), and indium tin zinc oxide (ITZO). In this case, during the process described with reference to FIG. 4I, an etchant capable of etching the lower layer 201 including the third metal layer 201*a* may be selected according to the kind of the third metal layer 201*a*.

In addition to copper, the fourth metal layer (refer to 203*a* in FIG. 4F) may be formed of one selected from the group consisting of aluminum, an aluminum alloy, silver, and a silver alloy. During the process described with reference to FIG. 4K, an etchant capable of etching the upper layer 203 including the fourth metal layer 203a may be selected according to the kind of the fourth metal layer 203a.

In another case, the photoresist pattern (refer to 180 in FIG. 4H) of FIG. 4H may be removed after etching the lower layer 201 formed of titanium molybdenum and before etching the upper layer 203 formed of copper.

Meanwhile, the above-described embodiments pertain to an example in which both the pixel electrode 125 and the common electrode 121 are formed in the same layer. However, the present invention may be applied to a fringe-field switching (FFS)-mode LCD device in which one selected out of the pixel electrode 125 and the common electrode 121 is formed as a plate type in a different layer from the other and LCs are driven according to a fringe field.

As described above, in fabrication of the IPS-mode LCD device according to the present invention, the formation of the pixel electrode 125 and the common electrode 121 may include depositing two different metal layers (refer to 201a and 203a of FIG. 4G) and patterning the two metal layers 201a and 203a using a selective etching process. That is, the lower layer (refer to 201 in FIG. 4I) of the metal pattern (refer to 205 in FIG. 4H) having a double structure may be etched using the upper layer (refer to 203 in FIG. 4K) as a blocking mask. Thus, the central common electrode 121 and the pixel electrode 125 may be formed to have a fine line width of about 0.5 to 1.5 µm.

Therefore, the present invention enables formation of fine patterns without varying the resolution of an exposure tool.

As a result, an IPS-mode LCD device may have an improved aperture ratio as compared with a conventional IPS-mode LCD device having a line width of about 2.5 µm or more.

In the IPS-mode LCD device, since LCs are driven according to a horizontal electric field between the common electrode 121 and the pixel electrode 125, it is impossible to drive LCs disposed on the common electrode 121 and the pixel electrode 125.

Thus, an aperture ratio may be reduced by as much as the areas of the common electrode 121 and the pixel electrode 125. However, in the IPS-mode LCD device according to the present invention, the central common electrode 121 and the pixel electrode 125 may be formed to have a fine line width so that a region in which LCs are not driven on the common electrode 121 and the pixel electrode 125 can be reduced to improve the aperture ratio.

The aperture ratio of the IPS-mode LCD device will now be examined in further detail with reference to Table 1, which shows simulation results of the aperture ratio of the IPS-mode LCD device relative to a line width.

TABLE 1

|  | A | B |
|---|---|---|
| Line width of electrode | 2.5 µm | 0.5 to 1.0 µm |
| Aperture ratio | 0% (Basis) | 11.2% improvement |

Referring to Table 1, it can be confirmed that when A has an electrode line width of about 2.5 µm and an aperture ratio of 0, b has an electrode line width of about 0.5 to 1.0 µm and an aperture ratio that is improved by as much as 11.2%.

Here, A refers to a conventional IPS-mode LCD device, and formation of conventional pixel electrodes and central common electrodes with a line width of less than about 2.5 µm is technically limited due to the resolution limit of current exposure tools.

In contrast, B refers to an IPS-mode LCD device according to an embodiment of the present invention. A lower layer of a metal pattern having a double structure may be etched using an upper layer thereof as a blocking mask so that a central common electrode and a pixel electrode can be formed to have a fine line width of about 0.5 to 1.5 µm. As a result, the aperture ratio may be improved by as much as 11.2%.

As described above, in fabrication of an array substrate of an IPS-mode LCD device according to the present invention, a pixel electrode and a central common electrode can be patterned by selectively etching heterogeneous metal layers, and formed to have a fine line width.

As a result, the IPS-mode LCD device according to the present invention can have an improved aperture ratio as compared with a conventional IPS-mode LCD device.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A method of fabricating an array substrate for an in-plane switching (IPS)-mode liquid crystal display (LCD) device, the method comprising:
    sequentially forming a first metal layer and a second metal layer on a substrate;
    forming a photoresist pattern on the second metal layer, the photoresist pattern having a first line width;
    etching the first metal layer and the second metal layer exposed outside the photoresist pattern to form a first metal pattern and a second metal pattern of a double-layered structure having a second line width smaller than the first line width;
    removing the photoresist pattern;
    selectively etching the first metal pattern using the second metal pattern as a mask and a first etchant for selectively etching the first metal pattern to have a third line width smaller than the second line width to form a pixel electrode and a common electrode; and
    selectively etching and removing the second metal pattern using a second etchant for selectively etching the second metal pattern.

2. The method of claim 1, wherein the first line width ranges from about 2.5 µm to about 3.5 µm, the second line width ranges from about 1.5 µm to about 2.5 µm, and the third line width ranges from about 0.5 µm to about 1.0 µm.

3. The method of claim 1, wherein the first metal layer is formed of one selected from the group consisting of titanium molybdenum (MoTi), molybdenum, titanium, a molybdenum alloy, a titanium alloy, indium tin oxide (ITO), indium zinc oxide (IZO), and indium tin zinc oxide (ITZO).

4. The method of claim 2, wherein the second metal layer is formed of one selected from copper (Cu), aluminum (Al), an aluminum alloy, silver (Ag), and a silver alloy.

5. The method of claim 3, wherein the first metal layer is formed of titanium molybdenum, the second metal layer is formed of copper, the first etchant contains hydrogen peroxide ($H_2O_2$) and fluorine (F), and the second etchant contains potassium sulfate ($K_2SO_4$) and an organic acid.

6. The method of claim 5, wherein each of the first and second etchants includes an inhibitor and a surfactant.

7. The method of claim 1, wherein the forming of the first and second metal patterns comprises etching the first and second metal layers using a mixed etchant, wherein the mixed etchant includes potassium sulfate, hydrogen peroxide, fluorine, an inhibitor, and a surfactant.

8. The method of claim 1, further comprising, before the forming of the first metal layer:

forming gate lines and data lines on the substrate across each other to define pixel regions, forming a common line in parallel to and apart from the gate line, and forming a thin film transistor (TFT) on each of the pixel regions to be connected to the gate line and the data line; and forming a protection layer on the TFT.

9. The method of claim 8, wherein the forming of the pixel electrode and the common electrode comprises forming a subsidiary common pattern and a subsidiary pixel pattern on the protection layer in each of the pixel regions to be apart from and opposite each other parallel to the gate line, the subsidiary common pattern configured to connect all one ends of common electrodes, and the subsidiary pixel pattern configured to connect all one ends of pixel electrodes.

10. The method of claim 9, wherein the forming of the common line comprises forming an outermost common electrode in parallel to the data line in each of the pixel regions, the outermost common electrode branched from the common line, and the forming of the protection layer comprises forming a drain contact hole exposing the drain electrode and a common contact hole exposing the outermost common electrode, wherein the subsidiary common pattern is in contact with the outermost common electrode through the common contact hole, and the subsidiary pixel pattern is in contact with the pixel electrode through the drain contact hole.

11. The method of claim 8, wherein the TFT includes a gate electrode, a gate insulating layer, a semiconductor layer, and source and drain electrodes.

* * * * *